United States Patent
Guo et al.

(10) Patent No.: US 10,741,454 B2
(45) Date of Patent: Aug. 11, 2020

(54) BOUNDARY PROTECTION FOR CMOS MULTI-THRESHOLD VOLTAGE DEVICES

(71) Applicant: International Business Machines Corporation, Armonk, NY (US)

(72) Inventors: Jing Guo, Niskayuna, NY (US); Ekmini A. De Silva, Slingerlands, NY (US); Nicolas Loubet, Guilderland, NY (US); Indira Seshadri, Niskayuna, NY (US); Nelson Felix, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/059,319

(22) Filed: Aug. 9, 2018

(65) Prior Publication Data
US 2020/0051872 A1 Feb. 13, 2020

(51) Int. Cl.
| H01L 21/8238 | (2006.01) |
| --- | --- |
| H01L 21/8234 | (2006.01) |
| H01L 21/768 | (2006.01) |
| H01L 27/108 | (2006.01) |

(52) U.S. Cl.
CPC ........... *H01L 21/823857* (2013.01); *H01L 21/76877* (2013.01); *H01L 21/823431* (2013.01); *H01L 21/823821* (2013.01); *H01L 21/823864* (2013.01); *H01L 27/10826* (2013.01); *H01L 27/10879* (2013.01); *H01L 21/823878* (2013.01)

(58) Field of Classification Search
CPC ............... H01L 21/823857; H01L 21/823821
See application file for complete search history.

(56) References Cited

U.S. PATENT DOCUMENTS

| 8,598,653 | B2 | 12/2013 | Juengling | |
| --- | --- | --- | --- | --- |
| 9,911,840 | B2 | 3/2018 | Lui et al. | |
| 2006/0063369 | A1* | 3/2006 | Lu | B82Y 30/00 438/618 |

(Continued)

FOREIGN PATENT DOCUMENTS

WO 2017111954 A1 6/2017

OTHER PUBLICATIONS

Kuhn et al., ed. ASM Handbook, vol. 8, Mechanical Testing and Evaluation, pp. 26-48, 2000 (Year: 2000).*

(Continued)

*Primary Examiner* — Cuong Q Nguyen
*Assistant Examiner* — Shih Tsun A Chou
(74) *Attorney, Agent, or Firm* — Cantor Colburn LLP; Vazken Alexanian (57) ABSTRACT

Methods are presented for forming multi-threshold field effect transistors. The methods generally include depositing and patterning an organic planarizing layer to protect underlying structures formed in a selected one of the nFET region and the pFET region of a semiconductor wafer. In the other one of the nFET region and the pFET region, structures are processed to form an undercut in the organic planarizing layer. The organic planarizing layer is subjected to a reflow process to fill the undercut. The methods are effective to protect a boundary between the nFET region and the pFET region.

20 Claims, 5 Drawing Sheets

(56) References Cited

U.S. PATENT DOCUMENTS

| | | | |
|---|---|---|---|
| 2010/0317181 A1* | 12/2010 | Chung | H01L 21/823821 |
| | | | 438/585 |
| 2014/0323001 A1* | 10/2014 | Schmidt | C08J 3/24 |
| | | | 442/59 |
| 2016/0111328 A1* | 4/2016 | Mei | G06F 3/044 |
| | | | 257/786 |
| 2017/0358578 A1 | 12/2017 | Li | |
| 2018/0019343 A1 | 1/2018 | Asami | |
| 2018/0096898 A1 | 4/2018 | Yu et al. | |

OTHER PUBLICATIONS

Biyikli, N., Haider, A., Deminskyi, P. et al. (2017). Self-aligned nanoscale processing solutions via selective atomic ayer deposition of oxide, nitride, and metallic films. Low-Dimensional Materials and Devices 2017, vol. 10349, p. 103490M-1-M20 (21 pages total).
Ghazali, N. A. B., Ebert, M., Ditshego, N. M. et al. (2016). Top-down fabrication optimisation of ZnO nanowire-FET by sidewall smoothing: Microelectronic Engineering 159:pp. 121-126.

\* cited by examiner

BOUNDARY PROTECTION FOR CMOS MULTI-THRESHOLD VOLTAGE DEVICES

BACKGROUND

The present invention relates in general to semiconductor fabrication methods and resulting structures. More specifically, the present invention relates to complementary metal oxide semiconductor (CMOS) boundary protection for vertical tunneling field effect transistors.

In an integrated circuit, transistors such as metal oxide semiconductor field effect transistors (MOSFETs) have a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode. Multi-threshold CMOS (MTC-MOS) is a variation of CMOS chip technology that has transistors with multiple threshold voltages (Vth) in order to optimize delay or power.

SUMMARY

Embodiments of the present invention are generally directed to methods of fabricating integrated circuits including one or more vertical tunneling field effect transistors (VTFET). A non-limiting example of a method for protecting a boundary between an n-type doped field effect transistor (nFET) region and a p-type doped field effect transistor (pFET) region in a semiconductor device includes conformally depositing a work function metal over channel structures provided in the nFET region and the pFET region. An organic planarizing layer is deposited and patterned to block the channel structures in a selected one of the nFET region and the pFET region. A nominal thickness of the work function metal is removed from the other one of the nFET and pFET region, wherein removing the nominal thickness laterally removes a portion of the work function metal to form an undercut in the organic planarizing layer. The organic planarizing layer is reflowed to fill the undercut and completely cover the work function metal underlying the organic planarizing layer. A remaining portion of work function metal is fully removed from the other one of the nFET region and the pFET region, wherein fully removing the remaining work function metal does not remove any additional amount of the work function metal underlying the organic planarizing layer.

A non-limiting example of a method for protecting a boundary between an nFET region and a pFET region according to aspects of the invention includes depositing and patterning an organic planarizing layer to protect underlying structures formed in a selected one of the nFET region and the pFET region. Structures in the other one of the nFET region and the pFET region are processed to form an undercut in the organic planarizing layer. The organic planarizing layer is reflowed to fill the undercut, wherein reflowing includes heating the organic planarizing layer to temperature greater than a glass transition temperature of the organic planarizing layer.

A non-limiting example of a method for protecting a boundary between an nFET region and a pFET region according to aspects of the invention includes depositing and patterning an organic planarizing layer to protect underlying structures formed in a selected one of the nFET region and the pFET region. Structures in the other one of the nFET region and the pFET region are processed to form an undercut in the organic planarizing layer. The organic planarizing layer is reflowed to fill the undercut, wherein reflowing includes decrosslinking the organic planarizing layer by exposing the organic planarizing layer to activating radiation and/or thermal radiation in an amount effective to cause the decrosslinking and reflow of the organic planarizing layer.

DETAILED DESCRIPTION

Embodiments of the present invention are generally directed to boundary protection during fabrication of n-type doped field effect transistors and p-type doped field effect transistors for a multi-threshold complementary metal oxide semiconductors (MTCMOS). At tight pitches, boundary protection between the n-type doped field effect transistor (nFET) region and the p-type doped field effect transistors (pFET) region during deposition of the n-type doped work function metals and the p-type doped work function metals (WFM) in the respective regions is an issue due to edge placement accuracy. Inaccurate edge placement leads to unwanted removal of the work function metal material in the blocked regions during fabrication, wherein the work function metal can be responsible for setting the threshold voltage in the MTCMOS devices.

Embodiments of the present invention generally include controlled reflow of an organic planarization layer (i.e., the block mask) during masking and etching of the WFM in the nFET or pFET region. By way of example, trilayer including an organic planarization layer can be patterned and used to mask the pFET region during formation of the p-type WFM in the pFET region. A wet etch process is utilized to remove a portion of the WFM having a nominal thickness from an nFET region. The block mask provided by the patterned organic planarizing layer serves to protect the pFET region during the wet etch process to remove the p-type WFM from the nFET region. However, patterning the organic planarization layer exposes a sidewall portion of the p-type WFM in the pFET region. As a result, removing the nominal thickness of the p-type WFM from the nFET regions by the wet etch process laterally etches the exposed portion of the p-type WFM underlying the organic planarizing layer in the pFET region, resulting in undercutting of the organic planarizing layer. Following removal of the nominal thickness of the p-type WFM from the nFET region, the organic planarization layer is subjected to a reflow step so as to cover and protect the exposed portion of the p-type WFM in the pFET region. Reflow of the organic planarization layer subsequent to nominal thickness removal of the WFM permits full removal of the p-type WFM in the nFET region without additional lateral etch of the work function metal in the pFET region, thereby protecting the n/p boundary during complete removal of the WFM from the nFET region. For example, the p-type WFM can be removed between vertically oriented fins in the nFET regions of a VFET structure, thereby minimizing the amount of lateral etch.

Reflow of the organic planarization layer is not intended to be limited and can be effected by heating above a glass transition temperature of the organic planarization material; heating above a decrosslinking reaction temperature of the organic planarization material; exposing the organic planarization layer to activating radiation at wavelengths effective to decrosslinking the organic planarization material with or without application of heat; or the like. The controlled reflow of the organic planarization layer subsequent to WFM nominal thickness etching in the nFET region is applicable to different CMOS transistors such as, for example, fin field effect transistors (FinFET), nanosheet FETs, or vertical finFETs (VFETs).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that comprises a list of elements is not necessarily limited to only those elements but can include other elements not expressly listed or inherent to such article or apparatus.

As used herein, the term "nominal thickness" generally refers a thickness of the WFM deposited on the horizontal surfaces of the substrate.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

It should also be understood that material compounds will be described in terms of listed elements, e.g., SiN, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown, because a person of ordinary skill in the art would recognize where masking and patterning processes are utilized to form the identified layers and openings, and to perform the identified selective etching processes, as described herein.

Figure 1:
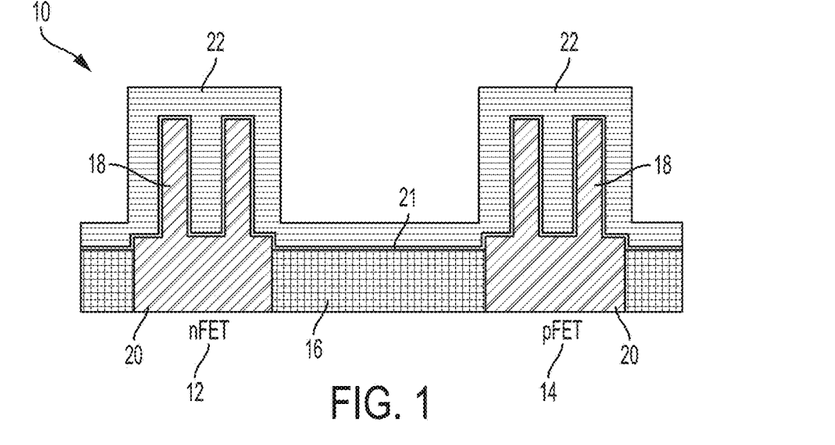
FIG. 1 depicts a cross-sectional view of a semiconductor structure after a fabrication operation according to one or more embodiments of the present invention.

FIGS. 1-6 depict a reflow process for providing boundary protection during fabrication nFET region and the pFET region for multi-threshold VFETs. Turning now to FIG. 1, there is shown a cross section of an exemplary intermediate CMOS transistor structure 10 including vertical fins for forming VFETs. The illustrated transistor structure 10 includes an nFET region 12 and a pFET region 14 in accordance with one or more embodiments. The nFET region 12 and the pFET region 14 are separated by a shallow trench isolation region 16 formed of an oxide, for example. The illustrated nFET and pFET regions 12, 14 include vertically oriented fins 18 (two of which are shown in each region) extending from a base substrate 20. Although two fins in each region are shown, it should be apparent that less than or greater than the two fins can be present as can be desired for different nFET and pFET VFET structures.

A dielectric layer 21 and p-type work function metal 22 are conformally deposited onto of the structure 10.

The base substrate 20 can include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The base substrate 20 can also include an organic semiconductor or a layered semiconductor such as, for example, Si/SiGe, a silicon-on-insulator or a SiGe-on-insulator. A portion or entire semiconductor substrate 20 can be amorphous, polycrystalline, or monocrystalline. In addition to the aforementioned types of semiconductor substrates, the base substrate employed in the present invention can also include a hybrid oriented (HOT) base substrate in which the HOT substrate has surface regions of different crystallographic orientation. The base substrate 20 can be doped, undoped or contain doped regions and undoped regions therein. The base substrate can contain regions with strain and regions without strain therein, or contain regions of tensile strain and compressive strain.

Each semiconductor fin 18 can be formed by lithography and etching. The lithographic step can include forming a photoresist (not shown) atop a substrate including a topmost semiconductor material, exposing the photoresist to a desired pattern of radiation and then developing the exposed photoresist utilizing a conventional resist developer. The pattern within the photoresist is then transferred into the topmost semiconductor material. The etch step can include a dry etch process, a chemical wet etch process, or any combination thereof. When a dry etch is used, the dry etch can be a reactive ion etch process, a plasma etch process, ion beam etching or laser ablation. The patterned photoresist material can be removed after transferring the pattern utilizing a conventional stripping process.

In one or more embodiments, each semiconductor fin 18 can be formed utilizing a SIT (sidewall image transfer) process. In a typical SIT process, spacers are formed on sidewall surfaces of a sacrificial mandrel that is formed on a topmost semiconductor material of a substrate. The sacrificial mandrel is removed and the remaining spacers are used as a hard mask to etch the topmost semiconductor material of the substrate. The spacers are then removed after each semiconductor fin 18 has been formed. In another embodiment, sequential SIT processes can be utilized to form fins with highly scaled fin width and pitches.

The number and size of fin channels 18 to be formed can be based on the intended current handling capacity of the electronic device structure. Formation of the fin channels generally includes deposition and lithographic patterning of a hardmask layer followed by an anisotropic etching process. Because there is no stop layer on the base substrate 20, the etch process can be time-based. A suitable anisotropic etching process includes reactive ion etching. The height of the fin channels 18 in the z direction can be in the range of about 30 nanometers (nm) to about 400 nm, or in the range of about 50 nm to about 300 nm, or in the range of about 75 nm to about 200 nm. In various embodiments, the width of the fin channels 20 in the x direction can be in the range of about 5 nm to about 30 nm, or about 10 nm to about 20 nm. In various embodiments, the aspect ratio of the fin channels 20 can be in the range of about 3 to about 40, or in the range of about 5 to about 20, or in the range of about 7 to about 10. In various embodiments, the fin channels 20 can have a length in the y direction in the range of about 10 nm to about 2000 nm, or in the range of about 20 nm to about 1000 nm, or in the range of about 25 nm to about 500 nm, where the length in the y direction is greater than the width in the x direction.

The hardmask (not shown) can include, for example, silicon oxide, silicon nitride (SiN), or any suitable combination of those. The hardmask can be deposited using a deposition process, including, but not limited to, PVD, CVD, PECVD, or any combination thereof.

The illustrated structure 10 can further include a bottom spacer layer (not shown), which can be deposited by any non-conformal deposition methods that provides a faster deposition rate on the planar surface and slower deposition rate on the sidewall surface including but not limited to plasma vapor deposition (PVD), high density plasma (HDP) deposition or the like. The bottom spacer layer can be disposed between the vertically oriented fin structures. The PVD or HDP process is highly directional and deposits the spacer onto the bottom of the trenches but less on fin sidewall. After directional deposition of bottom spacer, an etch-back process can be performed to remove the any residue of spacer materials from a sidewall of the fin 18. In PVD, a pure source material is gasified via evaporation, the application of high power electricity, laser ablation, or the like. The gasified material will then condense on the substrate material to create the desired layer. The bottom spacer can be a low k dielectric material. The term "low k dielectric" generally refers to an insulating material having a dielectric constant less than silicon dioxide, i.e., less than 3.9. Exemplary low k dielectric materials include, but are not limited to, dielectric nitrides (e.g., silicon nitride, SiBCN), dielectric oxynitrides (e.g., SiOCN), SiCN, or any combination thereof or the like. In one or more embodiments, the bottom spacer layer can have a thickness in the range of about 3 nm to about 10 nm, or in the range of about 3 nm to about 5 nm.

It should be apparent that the bottom spacer layer can be formed adjacent bottom source or drain regions (e.g., drain regions as well as the source regions for the completed VFETs), which are not shown. The source/drain regions can be formed by an epitaxial growth process that deposits a crystalline semiconductor material onto selected areas of the substrate 20 to form the bottom source/drain region. By way of example, the bottom source/drain regions for pFETs can be formed of SiGe:B, and bottom source/drain regions for nFETs can be formed of Si:P. The epitaxial growth process can include epitaxial materials grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain generally can range from about $1 \times 10^{19}$ cm$^{-3}$ to about $2 \times 10^{21}$ cm$^{-3}$, or, in other embodiments, from about $2 \times 10^{20}$ cm$^{-3}$ to about $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The fin 18 can be laterally etched to thin the fin channel to a desired width. Lateral thinning of the fin channel can be effected by an isotropic etch process. As such, the hardmask can have a width dimension greater than a width dimension of the fin.

The high k dielectric material 21 is conformally deposited onto the structure followed by conformal deposition of a work function metal gate material 22.

The high k gate dielectric material(s) can be a dielectric material having a dielectric constant greater than 3.9, 7.0, or 10.0. Non-limiting examples of suitable materials for the dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) 22 can be conformally deposited over the high k gate dielectric material. The type of work function metal(s) depends on the type of transistor and can differ between the nFET and pFET devices. Non-limiting examples of suitable work function metals include p-type work function metal materials and n-type work function metal materials. P-type work function materials include compositions such as titanium nitride, tantalum nitride, ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

By way of example, a p-type work function material 22 of titanium nitride (TiN) is deposited onto the structure 10. The thickness of the work function metal can be about 1 nm to about 10 nm.

Figure 2:
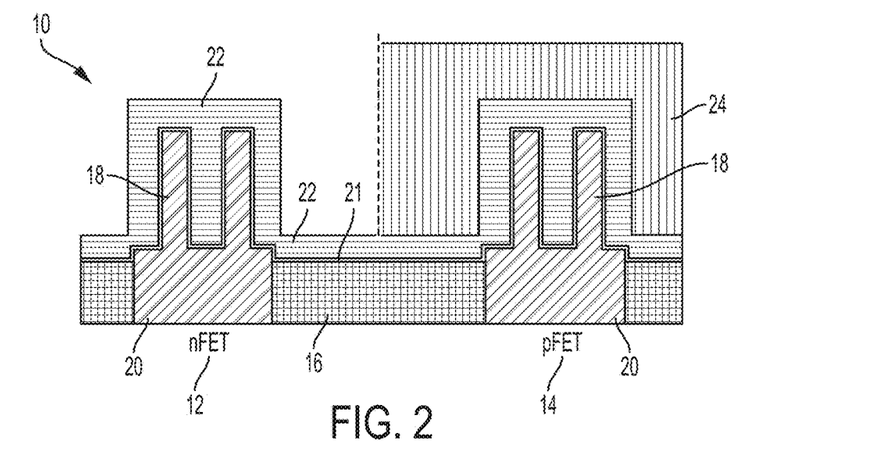
FIG. 2 depicts a cross-sectional view of the semiconductor structure after a fabrication operation according to one or more embodiments of the present invention.

In the cross sectional view of FIG. 2, an organic planarization layer 24 is deposited onto the substrate. The organic planarizing layer 24 can be lithographically patterned to protect the pFET region 14 during processing of the nFET region 12 using a hard mask and photoresist layer thereon.

Figure 3:
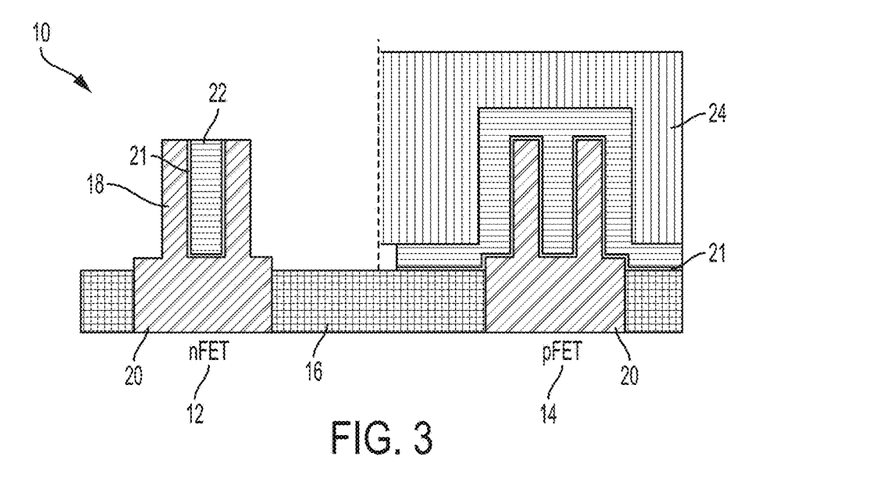
FIG. 3 depicts a perspective view of the semiconductor structure after a fabrication operation according to one or more embodiments of the present invention.

FIG. 3 illustrates the VFET structure of FIG. 2 subsequent to removal of a nominal thickness of the work function metal 22 (and high k dielectric layer 21) from the nFET region 12. The nominal thickness refers to the thinnest thickness of the work function metal whereas the thickness between the fins is significantly greater. Nominal thickness removal of the exposed portions of the work function metal in the nFET region 12 can be effected using a wet etch process. The wet etch process can include exposing the work function metal to an aqueous solution including ammonium hydroxide or hydrogen peroxide or hydrochloric acid, or combinations including at least one of the ammonium hydroxide, the hydrogen peroxide and/or the hydrochloric acid. Exemplary wet etch process include application of a standard clean SC-1 process, which generally includes exposing the substrate to an aqueous solution containing hydrogen peroxide ($H_2O_2$) and ammonium hydroxide ($NH_4OH$) at a temperature of about room temperature to about 50° C. Alternatively, a combination of the standard clean SC-1 process and a standard clean SC-2 process can be used. The standard clean SC-2 process generally includes exposing the WFM to an aqueous solution of hydrochloric acid (HCl) and $H_2O_2$. As shown, because the WFM underlying the organic planarizing layer 24 includes an exposed end portion, lateral etching of the work function metal 22 occurs resulting in undercutting in the pFET region 14. The extent of the undercut is typically about 2 nm to about 10 nm.

Figure 4:
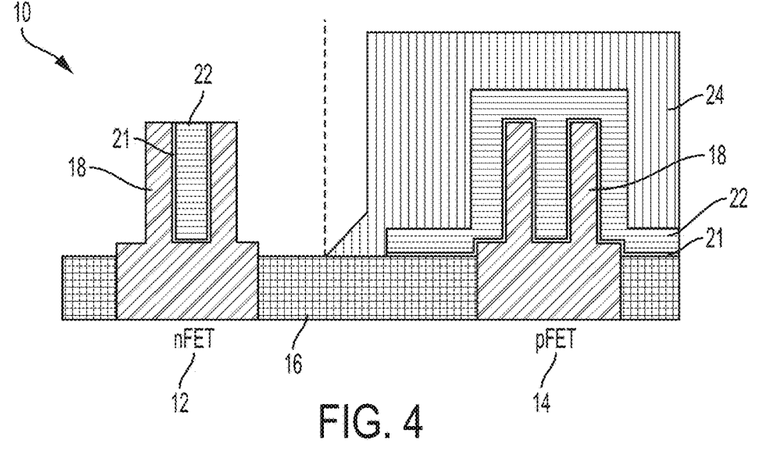
FIG. 4 depicts a cross-sectional view of the semiconductor structure after a fabrication operation according to one or more embodiments of the present invention.

FIG. 4 illustrates the VFET structure of FIG. 3 subsequent to reflowing the organic planarizing layer 24 so as to advantageously prevent further lateral etch of the work function metal 22 in the pFET region. As noted above, reflow of the organic planarizing layer can be effected thermally or exposure to activating radiation. The reflow of the organic planarization is in an amount effective to completely cover the exposed portion of the work function metal in the pFET region 14 as shown.

The organic planarizing material is selected to reflow upon exposure to activating energy and/or thermal radiation. For example, the organic planarizing layer can be selected from a material having a glass transition temperature greater than a first baking temperature utilized during initial deposition of the organic planarizing layer and reflows at a temperature greater than the glass transition temperature, i.e., a temperature greater than the initial baking temperature.

UV decrosslinkable functionalities are well known and provide decrosslinking reactions at wavelengths such as 365 nm and 248 nm. Likewise, thermally decrosslinkable functionalities can be used to define the organic planarizing layer, e.g., the organic planarizing material can be functionalized to provide forward Diels-alder or retro-Diels alder reactions. Still further, the organic planarizing layer can be selected to have a sufficiently low glass transition temperature such that heating the organic planarizing layer above the glass transition temperate results in reflow.

Exemplary thermally decrosslinkable functionalities are provided below:

Exemplary UV decrosslinking functionalities are provided below.

c)

Figure 5:
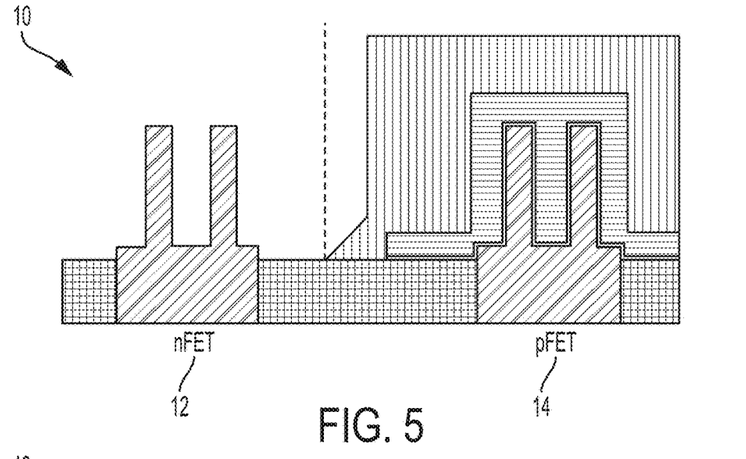
FIG. 5 depicts a cross-sectional view of the semiconductor structure after a fabrication operation according to one or more embodiments of the present invention.

FIG. 5 illustrates the VFET structure of FIG. 4 subsequent to full removal of the work function metal from between the fins 18 within the nFET region. The work function metal 22 is completely encapsulated and protected in the pFET region 14 by the reflowed organic planarization layer 24. Without reflow of the organic planarization layer 24, the undercut can be from about 20 nm to about 40 nm.

Figure 6:
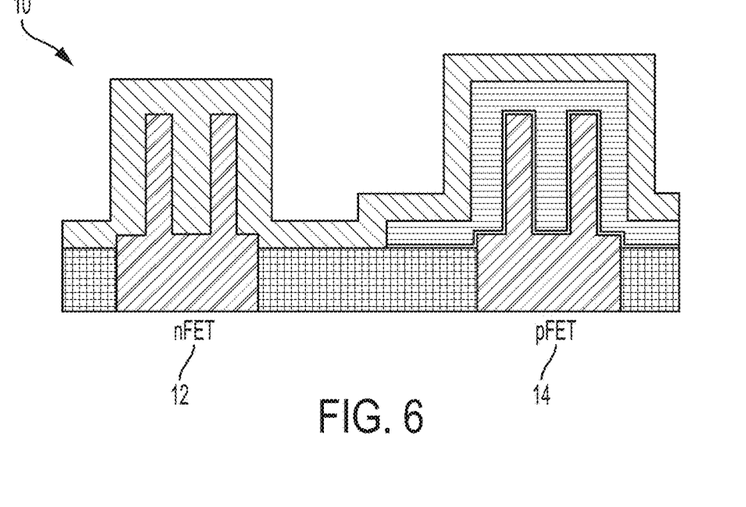
FIG. 6 depicts a cross-sectional view of the semiconductor structure after a fabrication operation according to one or more embodiments of the present invention.

FIG. 6 illustrates the VFET structure of FIG. 5 subsequent to stripping the organic planarizing layer 24 and conformal deposition of an n-type WFM on the nFET region 12. The nFET and pFET regions 12, 14 undergo further conventional steps to complete the respective VFETS including formation of top source/drain regions.

Figure 7:
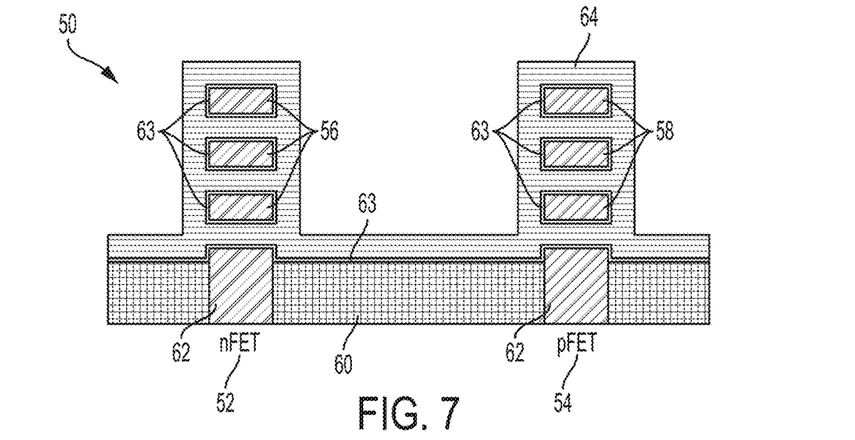
FIG. 7 depicts a cross-sectional view of the semiconductor structure after a fabrication operation according to one or more embodiments of the present invention.

FIGS. 7-12 depict a reflow process for providing boundary protection during fabrication nFET region and the pFET region for nanosheet FETs. Turning now to FIG. 7, there is shown an intermediate structure 50 including an nFET region 52 and a pFET region 54. The structure 50 includes an epitaxially grown multilayer structure of Si and SiGe layers that can be configured and arranged such that the Si channels 56 are provided in the nFET region 52 and the SiGe channels 58 for provided in the pFET region 54. The nFET region 52 and the pFET region 54 are separated by a shallow trench isolation region 60 formed of an oxide, for example. The illustrated nFET and pFET regions 12, 14 include three nanosheets within the multilayer structure spaced apart from a base substrate 62. Although three nanosheets are depicted in each region, it should be apparent that less than or greater than the three nanosheets can be present as can be desired for different nFET and pFET nanosheet structures. A dielectric layer 63 and p-type work function metal 64 are conformally deposited onto the structure 54.

Figure 8:
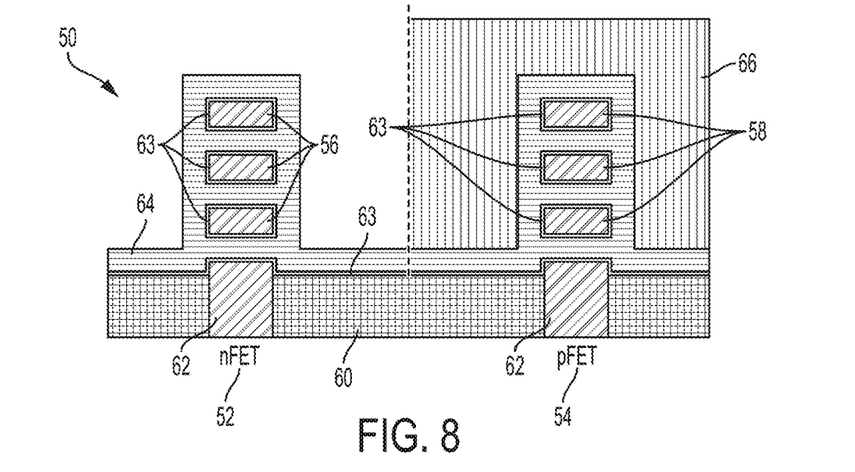
FIG. 8 depicts a cross-sectional view of the semiconductor structure after a fabrication operation according to one or more embodiments of the present invention.

FIG. 8 illustrates the nanosheet FET structure of FIG. 7 subsequent to deposition of an organic planarization layer 66 onto the substrate. The organic planarizing layer 24 can be lithographically patterned to protect the pFET region 54 during subsequent to processing of the nFET region 52 using a hard mask and photoresist layer thereon.

Figure 9:
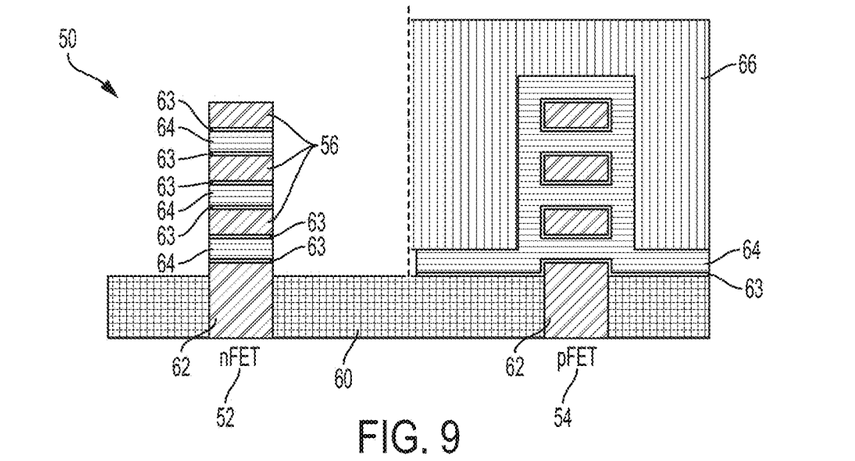
FIG. 9 depicts a cross-sectional view of the vertical field effect transistor structure after a fabrication operation according to one or more embodiments of the present invention.

FIG. 9 illustrates the nanosheet FET structure of FIG. 8 subsequent to removal of a portion of the work function metal 64 (and high k dielectric layer 21) from the nFET region 12, which removes a nominal thickness deposited onto the substrate. Removal of the exposed portions of the work function metal in the nFET region 52 can be effected using a wet etch process such as a standard clean SC-1 process, which generally includes exposing the substrate to an aqueous solution containing hydrogen peroxide ($H_2O_2$) and ammonium hydroxide ($NH_4OH$) at a temperature of about room temperature to about 50° C. The removal process can further include exposing the substrate to a $H_2O_2$ solution at an elevated temperature followed by exposing the substrate to the SC-1 aqueous solution for a second time. Alternatively, a combination of the standard clean SC-1 process and a standard clean SC-2 process at an elevated temperature can be used. The standard clean SC-2 process generally includes exposing the substrate to an aqueous solution of hydrochloric acid (HCl) and $H_2O_2$. As shown, because the WFM underlying the organic planarizing layer 24 includes an exposed end portion, lateral etching of the work function metal 64 in the pFET region 54 occurs resulting in undercutting of the organic planarizing layer 66. The extent of undercutting is about 2 nm to about 10 nm.

Figure 10:
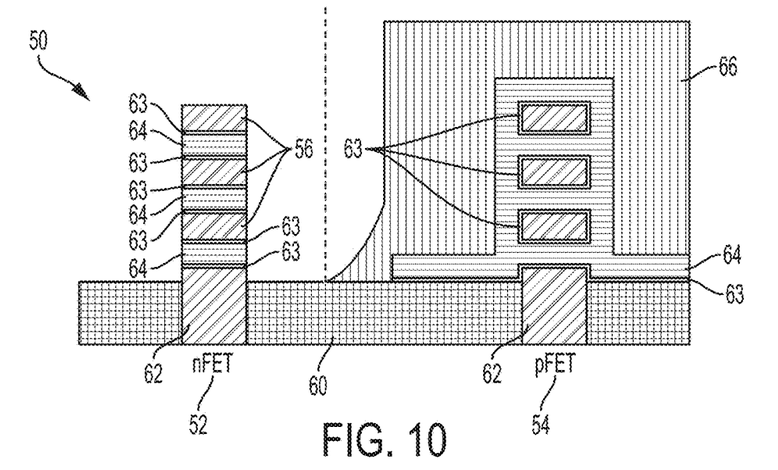
FIG. 10 depicts a cross-sectional view of the semiconductor structure after a fabrication operation according to one or more embodiments of the present invention.
Figure 11:
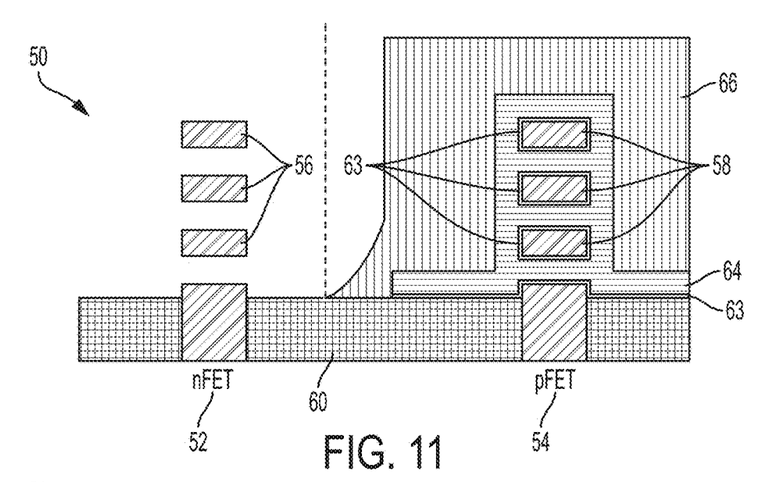
FIG. 11 depicts a cross-sectional view of the semiconductor structure after a fabrication operation according to one or more embodiments of the present invention.

FIG. 10 illustrates the nanosheet FET structure of FIG. 9 subsequent to reflowing the organic planarizing layer 66 so as to advantageously prevent further lateral etch of the work function metal 64 in the pFET region 54. As noted above, reflow of the organic planarizing layer 66 can be effected thermally or exposure to activating radiation. The reflow of the organic planarization is in an amount effective to completely cover the exposed portion of the work function metal in the pFET region 54 as shown FIG. 11 illustrates the nanosheet FET structure of FIG. 10 subsequent to full removal of the work function metal 64 from between the nanosheets 56 within the nFET region 52. In the pFET region 54, the work function metal 64 is completely encapsulated and protected by the reflowed organic planarization layer 66. Without reflow of the organic planarization layer 24, the undercut can be from about 20 nm to about 40 nm.

Figure 12:
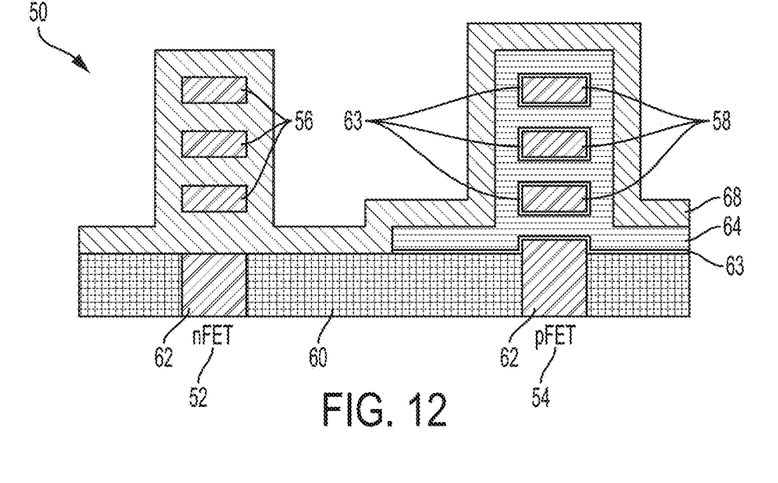
FIG. 12 depicts a cross-sectional view of the semiconductor structure after a fabrication operation according to one or more embodiments of the present invention.

FIG. 12 illustrates the nanosheet FET structure of FIG. 11 subsequent to stripping the organic planarizing layer 66 from the pFET region 54 and conformal deposition of an n-type work function metal on the substrate. The nFET and pFET regions 12, 14 undergo further conventional fabrication steps to complete the respective VFETS including formation of top source/drain regions.

Figure 13:
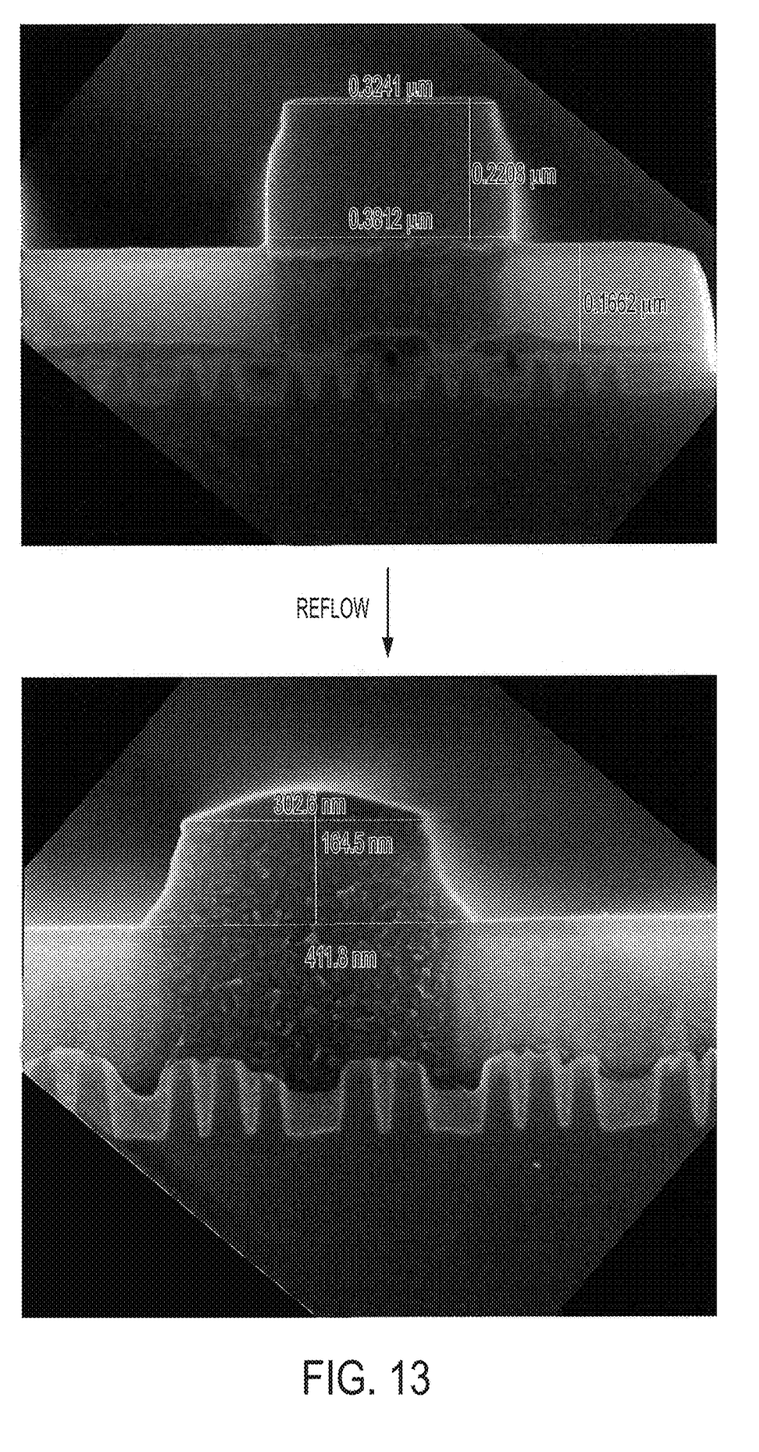
FIG. 13 depicts a scanning electron micrographs before and after reflow of an organic planarizing layer overlying a pFET region subsequent to nominal thickness removal of the work function metal and prior to full removal of the work function metal from an nFET region according to one or more embodiments of the present invention.

FIG. 13 are scanning electron micrographs before and after reflow of an organic planarizing layer overlying a pFET region subsequent to nominal thickness removal of the work function metal and prior to full removal of the work function metal from an nFET region. The amount of reflow of the organic planarizing layer was about 15 nm on each side.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for protecting a boundary between an n-type doped field effect transistor (nFET) region and a p-type doped field effect transistor (pFET) region in a semiconductor device, the method comprising:
   conformally depositing a work function metal over channel structures provided in the nFET region and the pFET region;
   depositing and patterning an organic planarizing layer to block the channel structures in a selected one of the nFET region and the pFET region;
   removing a nominal thickness of the work function metal from the other one of the nFET and pFET region, wherein removing the nominal thickness laterally removes a portion of the work function metal to form an undercut in the organic planarizing layer;
   reflowing the organic planarizing layer to fill the undercut and completely cover the work function metal underlying the organic planarizing layer; and
   fully removing a remaining portion of work function metal from the other one of the nFET region and the pFET region, wherein fully removing the remaining work function metal does not remove any additional amount of the work function metal underlying the organic planarizing layer.

2. The method of claim 1, wherein the selected one is the pFET region and the work function metal is a p-type work function metal.

3. The method of claim 1, wherein the selected one is the nFET region and the work function metal is an n-type work function metal.

4. The method of claim 1, wherein removing the nominal thickness of the work function metal and removing fully the remaining work function metal comprise a wet etching process.

5. The method of claim 4, wherein the wet etching process comprises exposing the work function metal in the other one of the pFET region and the nFET region to an aqueous solution comprising ammonium hydroxide or hydrogen peroxide or hydrochloric acid, or combinations comprising at least one of the ammonium hydroxide, the hydrogen peroxide and/or the hydrochloric acid.

6. The method of claim 1, wherein reflowing the organic planarizing layer comprises heating the organic planarizing layer at a temperature greater than a glass transition temperature of the organic planarizing layer.

7. The method of claim 1, wherein reflowing the organic planarizing layer comprises heating the organic planarizing layer to a temperature effective to decrosslink the organic planarizing layer.

8. The method of claim 1, wherein reflowing the organic planarizing layer comprises exposing the organic planarizing layer to activating radiation effective to decrosslink the organic planarizing layer.

9. The method of claim 1, wherein the channel structures comprise nanosheets, or one or more vertical fins, or one or more horizontal fins.

10. A method for protecting a boundary between an nFET region and a pFET region in a semiconductor device, the method comprising:
    conformally depositing a work function metal on a nFET region and a pFET region;
    depositing and patterning an organic planarizing layer to protect underlying structures including the work function metal in formed in a selected one of the nFET region and the pFET region;
    processing structures to remove a portion of the work function metal in the other one of the nFET region and the pFET region to form an undercut in the organic planarizing layer;
    reflowing the organic planarizing layer to fill the undercut, wherein reflowing comprises heating the organic planarizing layer to temperature greater than a glass transition temperature of the organic planarizing layer; and
    fully removing a remaining portion of the work function metal from the other one of the nFET region and the pFET region, wherein fully removing the remaining work function metal does not remove any additional amount of the work function metal underlying the organic planarizing layer.

11. The method of claim 10, wherein the structures and underlying structures comprise channels formed of nanosheets or vertical fins or horizontal fins.

12. The method of claim 10, wherein reflowing the organic planarizing layer is subsequent to a wet etch process to remove a nominal thickness of a work function metal from the other one of the pFET region and the nFET region.

13. The method of claim 12, wherein the selected one is the pFET region and the work function metal is a p-type work function metal.

14. The method of claim 12, wherein the selected one is the nFET region and the work function metal is an n-type work function metal.

15. The method of claim 10, wherein processing the structures to form the undercut in the organic planarizing layer comprises exposing the work function metal therein in the other one of the pFET region and the nFET region to a wet etch process prior to reflowing the organic planarizing layer to fill the undercut.

16. A method for protecting a boundary between an nFET region and a pFET region in a semiconductor device, the method comprising:
    conformally depositing a work function metal on a nFET region and a pFET region;
    depositing and patterning an organic planarizing layer to protect underlying structures including the work function metal formed in a selected one of the nFET region and the pFET region;
    processing structures to remove a portion of the work function metal in the other one of the nFET region and the pFET region to form an undercut in the organic planarizing layer;
    reflowing the organic planarizing layer to fill the undercut, wherein reflowing comprises decrosslinking the organic planarizing layer by exposing the organic planarizing layer to activating radiation and/or thermal radiation in an amount effective to cause the decrosslinking and reflow of the organic planarizing layer; and
    fully removing a remaining portion of the work function metal from the other one of the nFET region and the pFET region, wherein fully removing the remaining work function metal does not remove any additional amount of the work function metal underlying the organic planarizing layer.

17. The method of claim 16, wherein the structures and underlying structures comprise channels formed of nanosheets or vertical fins or horizontal fins.

18. The method of claim 16, wherein reflowing the organic planarizing layer is subsequent to a wet etch process to remove a nominal thickness of a work function metal from the other one of the pFET region and the nFET region.

19. The method of claim 18, wherein the selected one is the pFET region and the work function metal is a p-type work function metal.

20. The method of claim 16, wherein processing the structures to form the undercut in the organic planarizing layer comprises exposing a work function metal therein in the other one of the pFET region and the nFET region to wet etch process prior to reflowing the organic planarizing layer to fill the undercut.

* * * * *